United States Patent
Mottaez (10) Patent No.: US 9,047,426 B2
(45) Date of Patent: Jun. 2, 2015

(54) PERFORMING SCENARIO REDUCTION IN A CIRCUIT DESIGN FLOW

(75) Inventor: Amir H. Mottaez, Los Altos, CA (US)

(73) Assignee: RIVERBED TECHNOLOGY, INC., San Francisco, CA (US)

( * ) Notice: Subject to any disclaimer, the term of this patent is extended or adjusted under 35 U.S.C. 154(b) by 500 days.

(21) Appl. No.: 12/795,596

(22) Filed: Jun. 7, 2010

(65) Prior Publication Data
US 2011/0302547 A1  Dec. 8, 2011

(51) Int. Cl.
*G06F 17/50* (2006.01)

(52) U.S. Cl.
CPC .......... *G06F 17/504* (2013.01); *G06F 17/5045* (2013.01)

(58) Field of Classification Search
CPC .......................... G06F 2217/84; G06F 2217/08
USPC .................................................. 716/100–139
See application file for complete search history.

(56) References Cited

U.S. PATENT DOCUMENTS

| | | | |
|---|---|---|---|
| 6,763,506 B1 * | 7/2004 | Betz et al. ..................... | 716/108 |
| 7,092,838 B1 * | 8/2006 | Srinivas et al. ............... | 702/117 |
| 7,681,157 B2 * | 3/2010 | Buck et al. ..................... | 716/113 |
| 2003/0093763 A1 * | 5/2003 | McConaghy ..................... | 716/2 |
| 2006/0095889 A1 * | 5/2006 | Cote et al. ..................... | 716/21 |
| 2009/0216359 A1 * | 8/2009 | McConaghy et al. ........ | 700/103 |
| 2010/0095259 A1 * | 4/2010 | Tetelbaum ....................... | 716/6 |

* cited by examiner

*Primary Examiner* — Vuthe Siek
*Assistant Examiner* — Aric Lin
(74) *Attorney, Agent, or Firm* — Park, Vaughan, Fleming & Dowler LLP; Laxman Sahasrabuddhe (57) ABSTRACT

Some embodiments of the present invention provide techniques and systems for using scenario reduction in a design flow. The system can use scenario reduction to determine two subsets of scenarios that correspond to two sets of design constraints. Next, the system can optimize the circuit design using one of the sets of design constraints over the associated subset of scenarios. Next, the system can optimize the circuit design using both sets of design constraints over the union of the two subsets of scenarios. In some embodiments, the system can iteratively optimize a circuit design by: performing multiple optimization iterations on the circuit design over progressively larger subsets of scenarios which are determined by performing scenario reduction with relaxation; and performing at least one optimization iteration on the circuit design over a subset of scenarios which is determined by performing scenario reduction without relaxation.

16 Claims, 8 Drawing Sheets

FIG. 1
(Prior Art)

MATRIX 200

|  | Scenario S1 | Scenario S2 | • • • | Scenario Sk |
|---|---|---|---|---|
| (OB1, C1) | V201 | V202 | • • • | V203 |
| (OB2, C1) | V204 | V205 | • • • | V206 |
| ⋮ | ⋮ | ⋮ | ⋮ | ⋮ |
| (OBn, C1) | V207 | V208 | • • • | V209 |
| (OB1, C2) | V210 | V211 | • • • | V212 |
| (OB2, C2) | V213 | V214 | • • • | V215 |
| ⋮ | ⋮ | ⋮ | ⋮ | ⋮ |
| (OBn, C2) | V216 | V217 | • • • | V218 |
| ⋮ | ⋮ | ⋮ | ⋮ | ⋮ |
| (OB1, Cm) | V219 | V220 | • • • | V221 |
| (OB2, Cm) | V222 | V223 | • • • | V224 |
| ⋮ | ⋮ | ⋮ | ⋮ | ⋮ |
| (OBn, Cm) | V225 | V226 | • • • | V227 |

FIG. 2

MATRIX 300

|  | S-322 | S-324 | S-326 |
|---|---|---|---|
| CO-302 | -2.5 | -2.5 | -2.4 |
| CO-304 | -3.0 | -2.0 | -2.9 |
| CO-306 | -0.7 | -0.8 | 0.5 |
| CO-308 | 0.2 | 0.4 | 0.3 |

BOOLEAN MATRIX 350

|  | S-322 | S-324 | S-326 |
|---|---|---|---|
| CO-302 | 1 | 1 | 0 |
| CO-304 | 1 | 0 | 0 |
| CO-306 | 0 | 1 | 0 |
| CO-308 | 1 | 0 | 0 |

PERFORMING SCENARIO REDUCTION IN A CIRCUIT DESIGN FLOW

TECHNICAL FIELD

This disclosure relates to electronic design automation (EDA). More specifically, this disclosure relates to methods and apparatuses for performing scenario reduction and using scenario reduction in a design flow.

BACKGROUND

Related Art

The relentless miniaturization and increasing complexity of integrated circuits have been key driving forces behind the rapid advances in computer technology.

The advance to smaller semiconductor geometries has increased the variability in process and operating conditions of integrated circuits. A process corner is a particular set of process conditions under which the circuit design may be manufactured. An operating corner is a particular set of operating conditions (e.g., temperature, voltage) under which the circuit design may operate. The term "corner" can refer to a process corner, an operating corner, or a combination thereof.

One reason for the increase in complexity of circuit designs is the introduction of a large number of operational modes (e.g., stand-by, mission, test, etc.). Specifically, some parts of the circuit design may be completely switched off in certain operational modes. Further, different operational modes can have drastically different voltages, clock speeds, etc.

It is desirable to ensure that a circuit design meets the functional and performance goals under all possible conditions that are expected to occur. Hence, circuit designers try to ensure that a circuit design meets the functional and performance goals under all combinations of process corners and operational modes. The term "Multi-Corner/Multi-Mode (MCMM) scenario," or "scenario" for short, refers to a combination of a particular corner and a particular operational mode.

Circuit optimization is a very complex task which can consume a significant portion of the circuit design time. It is not surprising, therefore, that the task of optimizing a circuit design across multiple scenarios can easily become impractical if the number of scenarios is too large.

Unfortunately, the number of scenarios over which circuit designs are desired to be optimized is increasing rapidly as semiconductor geometries become smaller and circuit designs become more complex.

SUMMARY

Some embodiments of the present invention provide techniques and systems for reducing the number of scenarios over which a circuit design is optimized. Optimizing a circuit design can involve modifying the circuit design so that one or more design constraints are met. Each scenario in the set of scenarios can be associated with a process corner, an operating condition, and/or an operating mode. During operation, the system can receive a set of scenarios over which the circuit design is to be optimized. Next, the system can compute values of constrained objects in the circuit design over the set of scenarios. A constrained object in the circuit design can be any object in the circuit design (e.g., a net, a gate, a pin or terminal of a gate, a timing end-point, etc.) which is required to meet one or more design constraints in one or more scenarios. The system can then determine a subset of scenarios based partly or solely on the values of the constrained objects, so that if the circuit design meets design constraints in each scenario in the subset of scenarios, the circuit design is expected to meet the design constraints in each scenario in the set of scenarios. For example, the subset of scenarios can be determined using the difference between the actual values of the constrained object and an associated threshold, e.g., the difference between the actual capacitive load on a gate's output and the maximum allowed capacitive load.

In some embodiments, the system can use the values of the constrained objects (which may have been computed for each scenario in the set of scenarios) and the set of scenarios to formulate an instance of a combinatorial problem which is equivalent to a set covering problem. Next, the system can use a solution to the instance of the combinatorial problem to determine the subset of scenarios. For example, the system can formulate an instance of the unate covering problem, and use the solution to determine the subset of scenarios.

In some embodiments, for each scenario in the set of scenarios, the value of at least one constrained object in the scenario is within a given range of a threshold value associated with the constrained object. In other words, the system can use the range to control the robustness of the scenario reduction process. If the range is high, the starting set of scenarios is much more conservative, and hence, the resulting scenario reduction is more robust. In some embodiments, the range can increase (i.e., the scenario reduction can become more robust or conservative) as the circuit design progresses through a circuit design flow.

In some embodiments, the system can relax values of some of the constrained objects in a scenario to obtain relaxed values of the constrained objects, wherein a relaxed value is better (i.e., less worse) than the original value. For example, if the slack for a timing end-point is equal to "−3," it may be relaxed to "−2.8." Next, the system can determine the subset of scenarios using the relaxed values of the constrained objects instead of the original values, thereby potentially decreasing the cardinality of the subset of scenarios. The system can employ different criteria for identifying candidate scenarios, and candidate constrained objects within those scenarios, for relaxation. For example, the system can use the ratio of the number of violating constrained objects in a scenario to the total number of violating constrained objects across all scenarios to select a scenario as a candidate for relaxation. The system can perform relaxation iteratively until a relaxation limit is reached. For example, system may determine that the relaxation limit has been reached if at least one of the following three conditions is met: (a) the reduced scenario set converges, i.e. the reduced set of iteration 'j' and 'j+1' is the same, (b) no additional constrained objects meet the criteria for relaxation, and/or (c) the number of scenarios and/or constrained objects that were relaxed has reached a pre-determined upper limit. In some embodiments, progressively fewer values of constrained objects are relaxed as the circuit design progresses through a circuit design flow, thereby decreasing the amount of relaxation in later stages of the design flow.

In some embodiments, the system can incorporate scenario reduction in a circuit design flow. Specifically, the system can determine a first subset of scenarios such that if the circuit design meets a first set of design constraints in each scenario in the first subset of scenarios, the circuit design is expected to meet the first set of design constraints in each scenario in the set of scenarios. The system can also determine a second subset of scenarios such that if the circuit design meets a second set of design constraints in each scenario in the second subset of scenarios, the circuit design is expected to meet the second set of design constraints in each scenario in the set of scenarios. For example, in some embodiments, the first set of design constraints does not include minimum-delay timing-constraints, and the second set of design constraints includes minimum-delay timing-constraints.

The system can then optimize the circuit design using the first set of design constraints over the first subset of scenarios to obtain a first optimized circuit design. In some embodiments, performance of the circuit optimization process can be improved by updating circuit information associated with only the first set of design constraints in only the first subset of scenarios. For example, the system can update maximum-delay timing-information in the circuit design for the first subset of scenarios; and not update minimum-delay timing-information in the circuit design for the first subset of scenarios.

Next, the system can optimize the first optimized circuit design using both the first set of design constraints and the second set of design constraints over both the first subset of scenarios and the second subset of scenarios to obtain a second optimized circuit design. In some embodiments, performance of the circuit optimization process can be improved by updating circuit information associated with only the second set of design constraints in only the second subset of scenarios. For example, the system can update maximum-delay timing-information in the circuit design for the first subset of scenarios; not update maximum-delay timing-information in the circuit design for scenarios that are only in the second subset of scenarios; update minimum-delay timing-information in the circuit design for the second subset of scenarios; and not update minimum-delay timing-information in the circuit design for scenarios that are only in the first subset of scenarios.

In some embodiments, the system can optimize the first optimized circuit design by iterating through the second subset of scenarios. For example, the system can order scenarios in the second subset of scenarios in decreasing order of relevance and/or importance. Then, in each iteration, a scenario from the second subset of scenarios can be selected, and the first optimized circuit design can be optimized over the first subset of scenarios and the selected scenario from the second subset of scenarios. This can speedup the optimization process since the circuit information associated with only the first subset of scenarios and the selected scenario from the second subset of scenarios needs to be updated.

In some embodiments, the system can optimize a circuit design over a set of scenarios by performing multiple optimization iterations. Specifically, the system can perform multiple optimization iterations on the circuit design over progressively larger subsets of scenarios progressively reducing the aggressiveness of the relaxation. Finally, the system can perform at least one optimization iteration on the circuit design over a subset of scenarios which is determined by performing scenario reduction without relaxation on the set of scenarios. For example, at the beginning of the multi-iteration optimization (say, N iterations) the system can perform scenario reduction without any relaxation to obtain subset of scenarios S. Next, in iteration j, where $1<j<N$, the system can perform scenario reduction with relaxation on subset of scenarios S, such that iteration j performs less relaxation than iteration (j−1). Finally, in iteration N, the system can analyze the optimized design over subset of scenarios S to determine if there are any outstanding violations, and if so, perform optimization over the subset of scenarios S.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Figure 1:
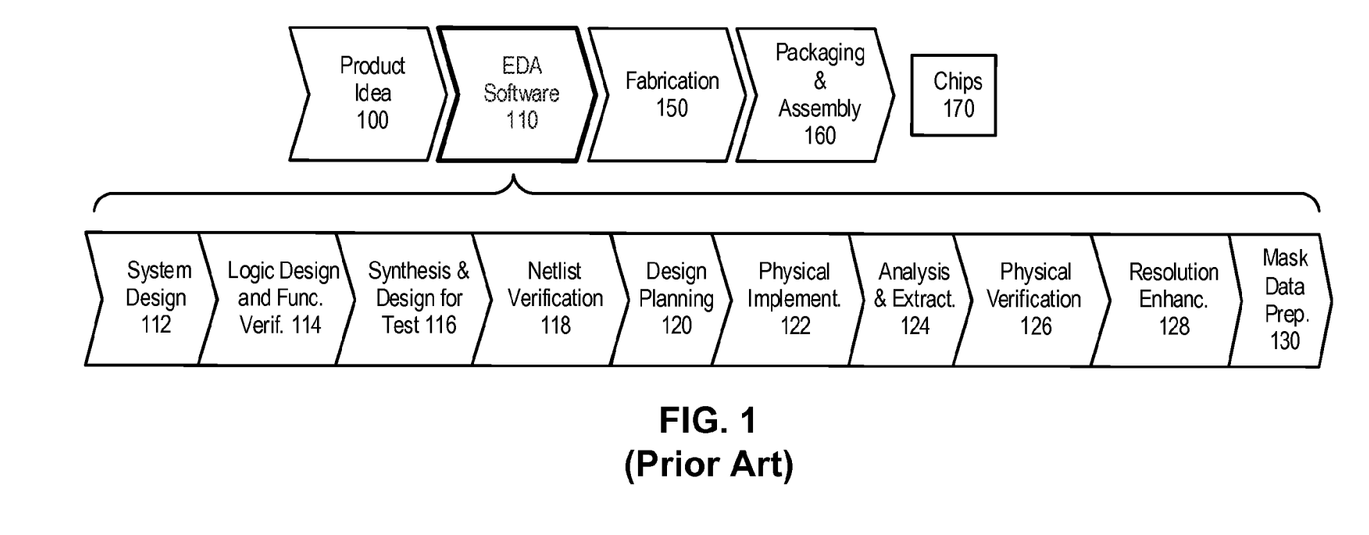
FIG. 1 illustrates various steps in the design and fabrication of an integrated circuit.

FIG. 1 illustrates various steps in the design and fabrication of an integrated circuit. The process starts with a product idea 100, which is realized using Electronic Design Automation (EDA) software 110. Chips 170 can be produced from the finalized design by performing fabrication 150 and packaging and assembly 160 steps.

A design flow that uses EDA software 110 is described below. Note that the design flow description is for illustration purposes only, and is not intended to limit the present invention. For example, an actual integrated circuit design may require a designer to perform the design flow steps in a different sequence than the sequence described below.

In the system design step 112, the designers can describe the functionality to implement. They can also perform what-if planning to refine the functionality and to check costs. Further, hardware-software architecture partitioning can occur at this step. In the logic design and functional verification step 114, a Hardware Description Language (HDL) design can be created and checked for functional accuracy.

In the synthesis and design step 116, the HDL code can be translated to a netlist, which can be optimized for the target technology. Further, tests can be designed and implemented to check the finished chips. In the netlist verification step 118, the netlist can be checked for compliance with timing constraints and for correspondence with the HDL code.

In the design planning step 120, an overall floor plan for the chip can be constructed and analyzed for timing and top-level routing. Next, in the physical implementation step 122, placement and routing can be performed.

In the analysis and extraction step 124, the circuit functionality can be verified at a transistor level. In the physical verification step 126, the design can be checked to correct any functional, manufacturing, electrical, or lithographic issues.

In the resolution enhancement step 128, geometric manipulations can be performed on the layout to improve manufacturability of the design. Finally, in the mask data preparation step 130, the design can be taped-out for production of masks to produce finished chips.

A circuit optimization technique that optimizes a circuit design over a set of scenarios must meet the functional and performance goals (timing, power, area, etc.) for the circuit design for all the scenarios. Some approaches optimize each scenario independently. These approaches suffer from poor quality of results and long run-times in converging on an optimal solution for all scenarios. Very often, these techniques fail to converge on an optimal solution because of "ping-pong" effects. For example, if an optimizing transformation performed in one scenario cancels the effects of an optimizing transformation performed in another scenario, the technique may "ping-pong" between these two scenarios, thereby preventing the solution from converging.

Some approaches model all of the scenarios at once and construct optimal solutions under the constraints of all scenarios. For example, these approaches evaluate the timing of the circuit by performing static timing analysis for all scenarios, and update timing information for all scenarios when an optimization transformation is applied to a logic gate. In these approaches, the system optimizes the circuit design based on the slack/timing, power, and logical DRC (design rule check) information over all scenarios. Although these approaches are superior to approaches that optimize one scenario at a time, they incur additional run-time and memory overhead. This is because, in these approaches, whenever timing, power, and DRC information (e.g., electrical design rules) is updated, it has to be updated across all scenarios. Note that the run-time and memory overhead increases with the number of scenarios. Since the number of scenarios is increasing rapidly as semiconductor geometries become smaller and circuit designs become more complex, these approaches are quickly becoming computationally impractical.

Some embodiments of the present invention overcome the run-time and memory overhead of approaches that concurrently analyze and optimize a circuit design over a set of scenarios by identifying a subset of scenarios that is sufficient for achieving optimal implementation results. In general, any constraint that is expected to have different values in different scenarios needs to be analyzed over the subset of scenarios. Once the subset of scenarios has been identified, the analysis and optimization is performed only over the subset of scenarios. For example, timing, power, and DRC analysis can be performed only on the subset of scenarios. All other scenarios that do not belong to the subset are not considered during subsequent analysis and optimization, thereby reducing the run-time and memory requirements.

To reduce the number of scenarios, some embodiments of the present invention start by evaluating the various constraints or optimization criteria (e.g., timing, power, electrical DRC, etc.) in each of the scenarios for each relevant object (timing end-point, net, cell, design, etc.) in the design. The term "constrained object" refers to a particular design object that is constrained (e.g. for timing, power, electrical DRC, etc.) in one or more scenarios The value of a constrained object is a quantification of the constraint for that object. In some embodiments the value can be the difference between the constraint value (e.g., the maximum or minimum allowable value) and the actual value at the constrained object. For example, the value of an end-point that is constrained for maximum delay is the difference between the required time (constraint value) and the arrival time (actual value) at the endpoint—i.e. the slack at the end-point. The values of the constrained objects can be organized in a matrix.

Figure 2:
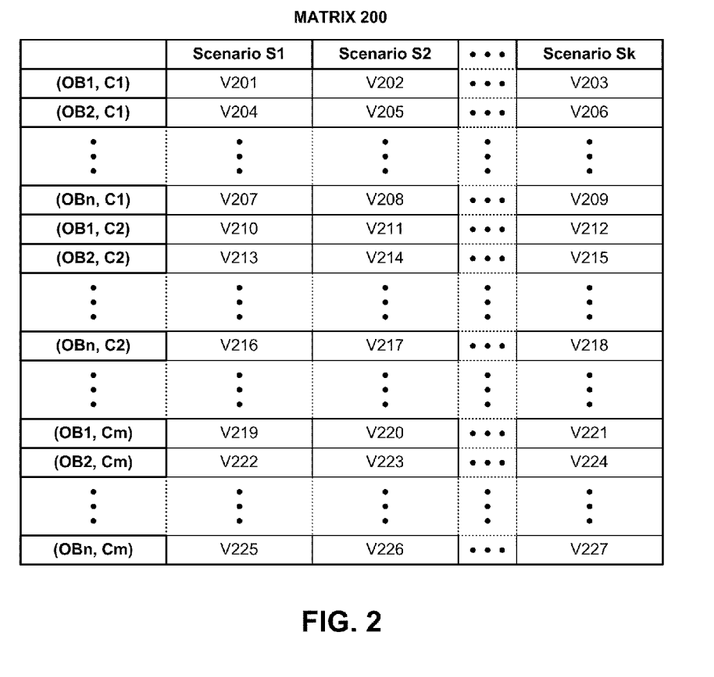
FIG. 2 illustrates a matrix which contains values of constrained objects in accordance with some embodiments of the present invention.

FIG. 2 illustrates a matrix which contains values of constrained objects in accordance with some embodiments of the present invention.

In matrix 200, each column is associated with a scenario, and each row is associated with a constrained object. For example, columns in matrix 200 correspond to k scenarios named S1, S2, . . . , Sk. A constrained object is represented as a tuple of an object and a constraint. For example, a constrained object that corresponds to constraint C1 for object OB1 is represented as (OB1, C1). Rows in matrix 200 correspond to n×m constrained objects named (OB1, C1), (OB2, C1), . . . , (OBn, Cm). For the sake of clarity and ease of discourse, matrix 200 illustrates that each constraint is applied to each object. However, that is not necessary, i.e., certain constraints may only apply to certain objects. In such cases, the matrix would not include rows that correspond to combinations that do not exist. Further, note that the rows in matrix 200 have been grouped by constraints, i.e., all constrained objects that include constraint C1 are grouped together, etc. Again, this has been done for the sake of clarity and ease of discourse. In general, the rows of the matrix can be arranged in any arbitrary order.

Values "V201" through "V227" in the cells of matrix 200 correspond to the values of the different constrained objects for the different scenarios. For example, value "V214" is the value of constrained object "(OB2, C2)" in scenario "S2." To take a concrete example, if "OB2" refers to a timing end-point and "C2" refers to a "maximum delay timing" constraint, then value "V214" could be the slack value at the timing end-point under scenario "S2." Some examples of constraints and the objects that they apply to are discussed in the following paragraphs. The following examples are for illustration purposes only and are not intended to limit the scope of the present invention.

A "maximum delay timing" constraint (also known as a "setup time" constraint) requires a signal to arrive at a timing end-point before the required time associated with the timing end-point. If this constraint is violated, the circuit design will most likely need to be operated at a slower speed. The value of this constraint can be represented in terms of slack (which is the difference between the required time and the arrival time of a signal), or in terms of a ratio between the slack and the clock period. The magnitude of this value can be negative (when the end-point does not meet the constraint) or positive (when the end-point satisfies the constraint). Note that a timing end-point can have multiple required times. In such cases, the system can either keep track of each slack separately (e.g., by creating a separate object for each required time), or the system can keep track of the worst-case slack across all required times associated with a timing end-point.

A "minimum delay timing" constraint (also known as a "hold time" constraint) requires a signal to arrive at a timing end-point after the required time. If this constraint is violated, the circuit will most likely be inoperable and/or have incorrect functionality (e.g., because the signal was not captured by a register). The value of this constraint can be represented in terms of slack (which is the difference between the arrival time and the required time of a signal), or in terms of a ratio between the slack and the clock period. The magnitude of this value can be negative (when the end-point does not meet the constraint) or positive (when the end-point satisfies the constraint). Note that a timing end-point can be associated with multiple arrival times. In such cases, the system can either keep track of each slack separately (e.g., by creating a separate object for each required time), or the system can keep track of the worst-case slack across all arrival times associated with a timing end-point.

The maximum delay timing constraint and the minimum delay timing constraint can apply to a timing end-point object. A worst case or average timing constraint can be applied to a collection of timing end-points. Specifically, when a constraint (e.g., maximum delay timing or minimum delay timing) is applied to an object (e.g., a path-group) that includes multiple constituent objects (e.g., a path-group includes multiple timing end-points), the value of the constraint can be derived from the values for the constraint for the constituent objects. For example, the value of the constraint can be an average of the constituent values or it can be the worst-case value.

An "electrical design rule" constraint imposes one or more limits on one or more electrical properties of an object. Examples of electrical design rule (DRC) constraints include: the maximum allowable signal transition time, the maximum allowable capacitive load on each gate, the maximum allowable fan-out of a net, and the maximum length of a net. In some embodiments the value of a DRC constraint can be represented in terms of the difference between the maximum allowable DRC value (as specified by the DRC constraint) and the actual value in the circuit design. In some embodiments, the system can keep track of the ratio of the difference to the maximum allowable value. Different DRC constraints apply to different types of objects. For example, the maximum allowable signal transition time constraint can apply to a timing end-point or a gate (e.g., the transition at the output of the gate must be within some range), or a net (e.g., the transition on any pin on the net must be less than some value). Similarly, the maximum allowable capacitive load on a logic gate can apply to a logic gate. The maximum allowable fan-out of a net and the maximum length of a net can apply to a net.

A "power" constraint can impose one or more limits on one or more power-related properties of a circuit design. Examples of power constraints include upper limits on the allowable leakage, dynamic, and/or total power of an object. The value of this constraint can be represented in terms of the difference between the maximum allowable value (as specified by the power constraint) and the actual value in the circuit design. Alternatively, the system can keep track of the ratio of the difference to the maximum allowable value. This constraint can be applied to different levels of objects in the circuit design. For example, the power constraint can be applied to the entire circuit design or to each leaf-level cell instance in the circuit design, or specific blocks of the design Once the values have been calculated for all constrained objects across all scenarios, the system can then use this information to identify a subset of scenarios such that if the circuit design is optimized for the subset of scenarios, the circuit design is expected to be optimized for all scenarios. Specifically, if the circuit design is optimized so that the value of a constrained object in the worst-case scenario meets the constraint, then it is very likely that all other scenarios will also meet the constraint.

Some embodiments of the present invention use the values of the constrained objects and the set of scenarios to formulate an instance of a combinatorial problem which is equivalent to the set covering problem. Next, the embodiments can use a solution to the instance of the combinatorial problem to determine the subset of scenarios. As used in this disclosure, two combinatorial problems are said to be equivalent to one another if an instance of any one of the combinatorial problems can be converted into an instance of the other in polynomial time.

For example, the system can use the values of the constrained objects and the set of scenarios to formulate an instance of a unate covering problem. Note that the unate covering problem is a combinatorial problem which is equivalent to the set covering problem. Next, the system can solve the instance of the unate covering problem to determine a subset of scenarios which need to be considered during optimization.

Figure 3:
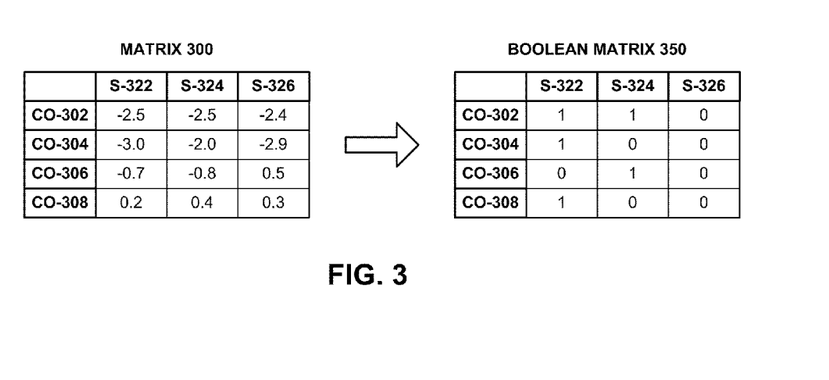
FIG. 3 illustrates how a unate covering problem can be formulated based on the values of the constrained objects and the set of scenarios in accordance with some embodiments of the present invention.

FIG. 3 illustrates how a unate covering problem can be formulated based on the values of the constrained objects and the set of scenarios in accordance with some embodiments of the present invention.

The unate covering problem can be defined as follows. Given a Boolean matrix, find a minimum set of columns so that, for each row that has at least one cell whose value is "1," the minimum set of columns covers at least one of those cells. Matrix 300 illustrates the values of constrained objects CO-302, CO-304, CO-306, and CO-308 for scenarios S-322, S-324, and S-326. Boolean matrix 350 illustrates the Boolean matrix for an instance of the unate covering problem based on matrix 300.

Boolean matrix 350 can be determined from matrix 300 as follows. First, for each row in matrix 300, the system can determine the worst-case value. In matrix 300 we assume that a negative value is a violating value. Hence, the most negative value or the least positive value is the worst-case value. Next, the system can place a "1" in cells of Boolean matrix 350 which correspond to the cells with the worst-case values. For example, in row CO-302 of matrix 300, scenarios S-322 and S-324 have the worst-case value. Hence, the corresponding cells in Boolean matrix 350 are set to "1." The other cell in row CO-302 of Boolean matrix 350 can be set to "0." In some embodiments all row values that are within a threshold of the worst-case value of that row can be assumed to "worst" and a 1 can be placed for their corresponding cell in matrix 350. For example, if the first row of matrix 300 is {−2.5, −2.4, −2.4998} and we use a threshold of 0.001, then the corresponding row in matrix 350 will be {1, 0, 1}.

Once Boolean matrix 350 is determined in this fashion, a unate cover can be determined. For example, the unate cover for Boolean matrix 350 consists of scenarios S-322 and S-324. These two scenarios can then be used to optimize the circuit design. Note that the initial set of scenarios contained three scenarios, which were reduced to two scenarios by formulating a unate covering problem.

The scenario reduction process can begin with a matrix that contains values for every constrained object in the circuit design, regardless of whether the constrained object violates the constraint. For example, the values in row CO-308 in matrix 300 are not violating, but have been included in matrix 300. This approach for creating the matrix can cause the matrix to contain a large number of rows, which can cause the scenario reduction problem to become computationally impractical because of the large memory requirements and the long run-times. Further, starting with a matrix that contains rows that do not have any violating values can result in larger reduced scenario sets.

For example, suppose there are two scenarios: scenario A and scenario B. Further, suppose that all constrained objects have large positive (i.e., non-violating) slacks in scenario B. Let us further assume that, for some constrained objects, the large positive slack in scenario B is the worst-case slack because, in scenario A, these constrained objects have an even larger positive slack. Further, let us assume that the situation in scenario A is as follows: at least some of the constrained objects have negative (i.e., violating) slacks. Now, if all positive and negative slacks are considered, then the scenario reduction process would select both scenarios A and B. However, if only negative slacks are considered, then the scenario reduction process would only select scenario A. Note that, since constrained objects in scenario B have large positive slacks, it is unlikely that an optimization process that only considers scenario A would create violations in scenario B. However, as explained below, the situation would be different if at least some of the positive slacks in scenario B were barely meeting timing (e.g., the slacks were small positive values).

If the scenario reduction process does not consider enough scenarios to compute the reduced set, then subsequent implementation steps (which do not see the scenarios that are not in the reduced set) can create unintended and undesired violations in the ignored scenarios. For example, suppose that the constrained objects have small positive slacks in scenario B. Specifically, suppose one timing end-point (ep1) in scenario A does not meet the timing requirements, while four timing end-points (ep2, ep3, ep4, and ep5) in scenario B barely meet the timing requirements (e.g., the timing end-points have small positive slacks) yet they are either not constrained in scenario A, or they have very large positive slacks in scenario A. If scenario reduction only considers violating constrained objects, i.e., timing end-point ep1, then it would return scenario A as its reduced set. Since subsequent implementation steps do not see scenario B, they may consider timing end-points ep2, ep3, ep4, and ep5 as either unconstrained or very loosely constrained, and degrade their timing in order to produce a smaller design. Although the optimized design may fix the timing violation in scenario A, it may create new timing violations in scenario B. In other words, a trade-off exists between performance and robustness: fewer scenarios increases performance, but decreases robustness.

Some embodiments of the present invention consider constrained objects that are violating (e.g., constrained objects with negative slacks) and those that are close to violating (e.g., constrained objects that barely meet the constraint).

In some embodiments, a constrained object can be considered to be close to violating (and therefore included in the matrix) if a K % degradation causes the constrained object to become violating (e.g., by becoming negative). For example, if a K % degradation in the arrival time at a timing end-point causes the end-point to violate its timing objective (e.g., by causing the arrival time to be greater than the required time), then the corresponding constrained object is included in the matrix. As another example, if a K % increase in the power consumption causes the constrained object to violate a power limit, then the constrained object is included in the matrix. The range of values (e.g., as determined by the value of K) can be based on the constraint type (max-delay, min-delay, power, DRC), and may be determined by analyzing the design libraries. The ranges can also be determined empirically based on the implementation tool flow and the point in the flow where scenario reduction is performed.

For example, in FIG. 3, constrained object CO-308 will not be included if the range is equal to 0.1. However, if the range is equal to 0.25, then constrained object CO-308 will be included because its value in scenario S-322 is equal to 0.2, which is less than 0.25. Note that constrained objects CO-302, CO-304, and CO-306 will be included in both cases because they have a negative value in at least one scenario.

A smaller K value can be chosen if performance of the multi-scenario implementation flow is the primary concern, and a larger K value can be chosen if robustness is the primary concern. Specifically, in some embodiments, a smaller K value can be chosen during earlier stages of a design flow because performance is usually the primary concern in these stages. As the circuit design progresses through the design flow, the value of K can be increased because, in later stages of the design flow, robustness becomes the primary concern.

Note that scenario reduction is exact in its reduction, i.e., scenario reduction includes any scenario with at least one constrained object whose slack is worse in that scenario than any other scenario. Consider a two-scenario example with 5000 constrained objects. If 4999 constrained objects (e.g., CO-0001, . . . , CO-4999) have their worst slack in scenario A while the remaining one constrained object (e.g., CO-5000) has its worst slack in scenario B, then scenario reduction will return both scenarios A and B as its reduced set.

Such exactness can lead to reduced scenario sets with larger cardinality which implies a slower run-time for the subsequent implementation steps. Such exactness may be desirable in the later stages of the implementation flow where accurate and detailed design models (which include information such as cross-talk, detailed signal routes with exact net delays, actual clock trees, etc.) are available. However, such exactness may not be desirable in the earlier stages of the design flow where the circuit design model inherently includes a greater amount of modeling error. Furthermore, designers iterate numerous times in the earlier stages of the implementation flow, while varying their constraints, floor plan, and design. Therefore, fast run-times are critically important in the earlier stages of the implementation flow.

Some embodiments of the present invention iteratively relax the constrained objects to produce reduced scenario sets with smaller cardinality. Relaxation is performed on scenarios which have only a few constrained objects that have worst-case values. Using the above-described example, scenario B is considered a candidate for relaxation, and constrained object CO-5000's slack in scenario B is relaxed (i.e., made less worse) to its value in scenario A. Scenario reduction will then return scenario A as the reduced set of scenarios, because now both scenarios A and B have the worst-case slack. In some embodiments, relaxation considers each constraint type separately, and uses the ratio of each scenario's violating (or near violating) constrained objects (of each constraint type) to the total number of violating (or near violating) constrained objects across all scenarios to select the candidate scenarios for relaxation. The process is iterative until the reduced set of scenarios converges, i.e. two iterations produce the same reduced scenario set, or when the amount of reduction reaches a predetermined limit.

Furthermore, the system can limit the percentage or number of constrained objects that are relaxed in each iteration. For example, the following two limits can be used: (1) the ratio of relaxed constrained objects (for a constraint type) to the total number of constrained objects (of that constraint type) in that scenario, and (2) the ratio of relaxed constrained objects (for a constraint type) to the total number of constrained objects (of that constraint type) across all scenarios.

As an illustrative example, let us assume that the system begins with 100 scenarios. In the first relaxation iteration, the system relaxes the values for 1% of the constrained objects. Next, the system can perform scenario reduction to obtain a reduced set of 90 scenarios. The system can then perform another round of relaxation based on these 90 scenarios, and relax another 2% of the constrained objects (for a running total of 3%). The system can then perform another round of scenario reduction to obtain a set of 87 scenarios. This iterative process can continue until the total percentage of constrained objects which have been relaxed reaches 10%.

Additionally, the system can place a limit on the amount of relaxation that is allowed. For example, if the current value of a constrained object is −2, and only 20% relaxation is allowed, then the system will not relax the value of the constrained object beyond −1.6. In some cases, such as in the case of max delay constraint on end-points, the maximum relaxation may be determined as a percentage of arrival degradation. For example, if the arrival time is 100, and the required time is 98, which gives us a slack of −2, the system may allow a 10% relaxation of the arrival time which means that the slack can be relaxed up to −12=98−(100*1.10).

Note that a trade-off exists between performance and exactness: increasing relaxation improves performance, but reduces exactness. The relaxation thresholds can depend on the implementation flow and the stage at which scenario reduction is invoked. Specifically, relaxation thresholds can be determined based on the constraint type (max-delay, min-delay, power, DRC), the implementation tool flow, and/or the point in the flow where scenario reduction is performed. Higher threshold values can be chosen if performance is the primary concern, and lower threshold values can be chosen if exactness is the primary concern. In some embodiments, higher threshold values can be chosen during earlier stages of a design flow because performance is usually the primary concern in these stages. As the circuit design progresses through the design flow, the threshold values can be decreased because, in later stages of the design flow, exactness becomes the primary concern.

Figure 4:
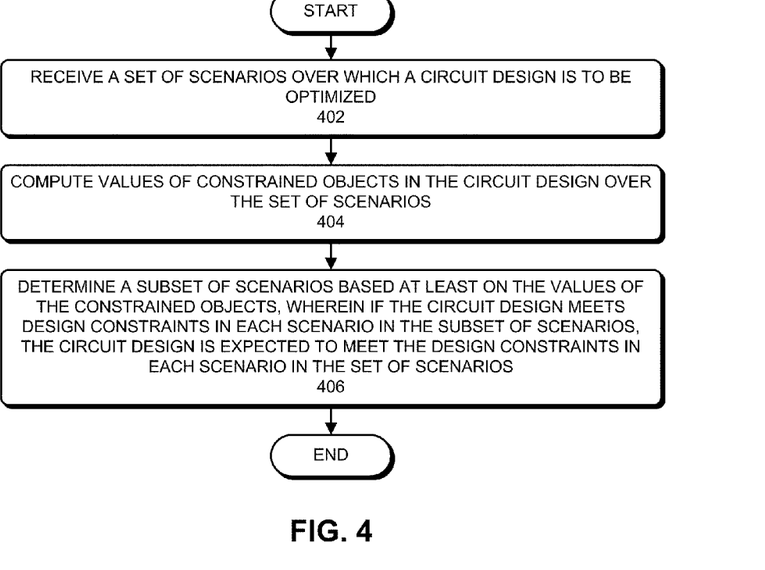
FIG. 4 presents a flowchart that illustrates a process for determining a subset of scenarios in accordance with some embodiments of the present invention.

FIG. 4 presents a flowchart that illustrates a process for determining a subset of scenarios in accordance with some embodiments of the present invention.

The process can begin by receiving a set of scenarios over which a circuit design is to be optimized (step 402). In some embodiments, each scenario in the set of scenarios is associated with at least one of: a process corner, an operating condition, or an operating mode.

Next, the system can compute values of constrained objects in the circuit design over the set of scenarios (step 404).

The system can then determine a subset of scenarios by using a computer, wherein the subset of scenarios is determined based at least on the values of the constrained objects, and wherein the subset of scenarios is such that if the circuit design meets design constraints in each scenario in the subset of scenarios, the circuit design is expected to meet the design constraints in each scenario in the set of scenarios (step 406).

Figure 5:
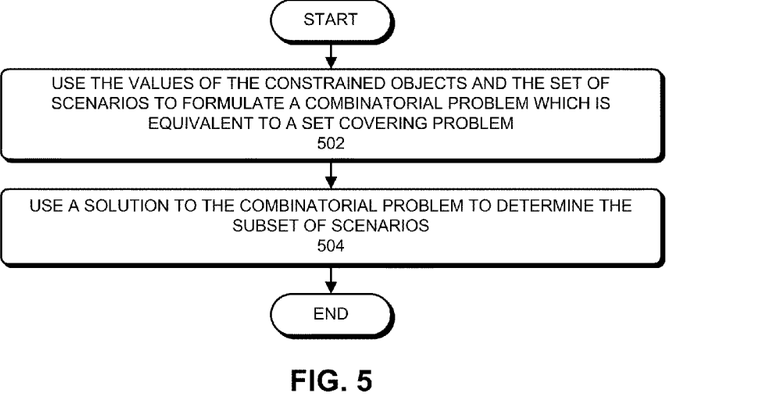
FIG. 5 presents a flowchart that illustrates a process for determining a subset of scenarios in accordance with some embodiments of the present invention.

FIG. 5 presents a flowchart that illustrates a process for determining a subset of scenarios in accordance with some embodiments of the present invention. The process illustrated in FIG. 5 can be used in step 406 in FIG. 4.

The process can begin by using the values of the constrained objects to formulate an instance of a combinatorial problem which is equivalent to a set covering problem (step 502). For example, the system can formulate an instance of a unate covering problem as illustrated in FIG. 3.

Next, the system can use a solution to the instance of the combinatorial problem to determine the subset of scenarios (step 504). For example, if the system formulates an instance of the unate covering problem as shown in FIG. 3, then the unate cover (which is a set of columns in the Boolean matrix) corresponds to the subset of scenarios.

Figure 6:
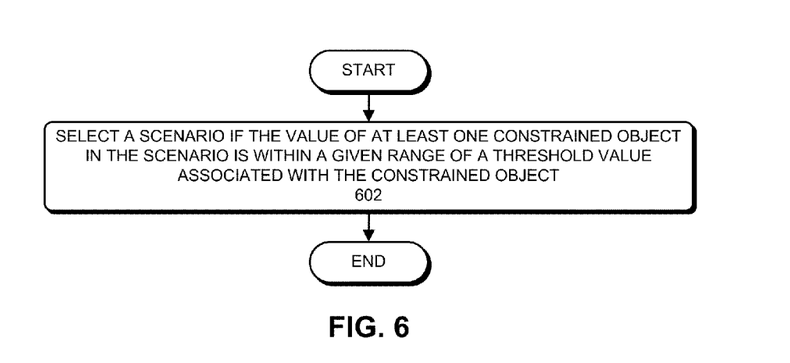
FIG. 6 presents a flowchart that illustrates a process for pruning scenarios in accordance with some embodiments of the present invention.

FIG. 6 presents a flowchart that illustrates a process for robust scenario reduction in accordance with some embodiments of the present invention. The process illustrated in FIG. 6 can be used in step 406 in FIG. 4.

A threshold value can be associated with a constrained object. For example, the system may determine that for a robust set of reduced scenarios the threshold value for timing slack is +2.3 (as opposed to 0), i.e., all constrained object slacks are that are less than +2.3 are considered to be violating and are included in the violation matrix. The system will select a scenario if the value of at least one constrained object in that scenario is smaller than that object's values in other scenarios even if the value is positive (i.e., when the threshold is positive, or in other words, the constrained object is meeting its constraint). (step 602). Not that, for each constraint type, the range can be determined globally across all scenarios for all violating objects, i.e., not on an object by object or scenario by scenario basis. Since the offset is moving the zero line it has to be done globally in order to maintain the relative magnitude of constrained object's values in different scenarios. For example, if an end-point's slack is −0.1 in scenario A and +0.2 in scenario B, and we consider any slack less that +2.3 as violating, then the end-point still has its worst value in scenario A. This is regardless of whether we use 0 or 2.3 as our threshold.

The threshold may be computed as a function of a specified percentage degradation (K %) in the constrained objects' actual value (in this disclosure the terms "constrained object value" "constrained object required value," and "constraint object actual value" have been used interchangeably). In this case, the threshold can be the largest positive constrained value associated with any constrained object (in any scenario) where a K % degradation in that constrained object's actual value can cause that constrained object to miss its required constraint. In the case of timing, for example, the threshold can be largest positive slack associated with any end-point (in any scenario) where a K % degradation in that end-point's arrival time can cause that end-point to miss its timing requirement (i.e., slack becoming negative). Further, note that the threshold may depend on the type of constraint and/or the stage in the design flow. Specifically, in some embodiments, the system can increase the threshold as the circuit design progresses through a circuit design flow.

Figure 7:
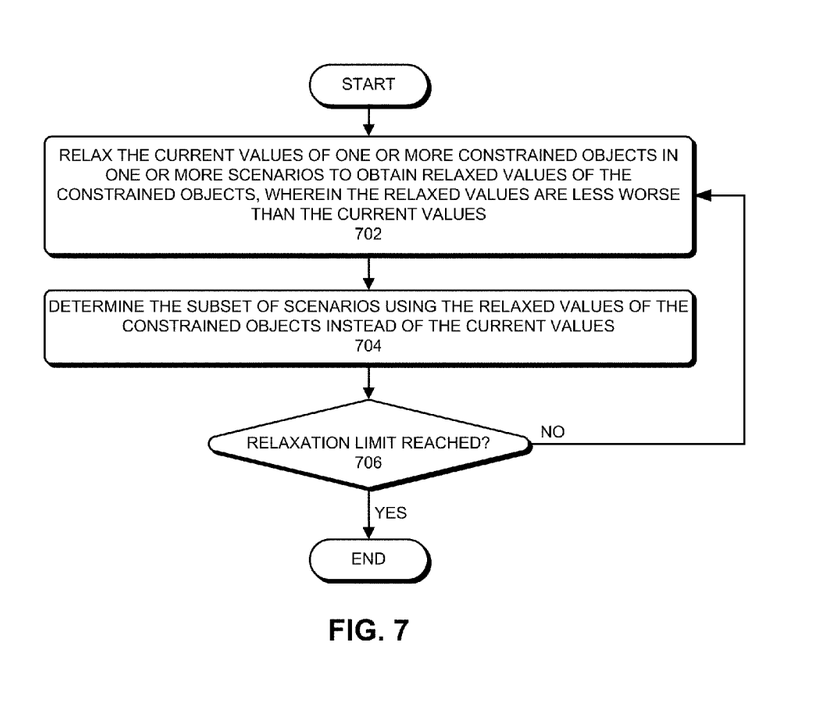
FIG. 7 presents a flowchart that illustrates a process for relaxing values of constrained objects in accordance with some embodiments of the present invention.

FIG. 7 presents a flowchart that illustrates a process for relaxing values of constrained objects in accordance with some embodiments of the present invention. The process illustrated in FIG. 7 can be used in step 406 in FIG. 4.

The process can begin by relaxing the current value of one or more constrained objects in one or more scenarios to obtain relaxed values of the constrained objects, wherein the relaxed values are better (i.e., less worse) than the current values (step 702). Note that the constrained object's value is relaxed to the value of that constrained object in another scenario with next worse value. Next, the system can determine the subset of scenarios using the relaxed values of the constrained objects instead of the current values (step 704). In some embodiments, the system can relax progressively fewer values of constrained objects as the circuit design progresses through a circuit design flow.

For example, in FIG. 3, the value "−0.8" of constrained object CO-306 in scenario S-324 may be relaxed to "−0.7"

which is the next worse value in that row. Note that in this example, after this relaxation the set of scenarios can be reduced to a single scenario, namely, S-322.

The system can perform relaxation iteratively, i.e., after determining a reduced set of scenarios using the relaxed values, the system can perform another round of relaxation on the reduced set and perform reduction (covering) on the reduced set, possibly computing a new reduced set that is a subset of the first reduced set. The iterations can continue until a desired condition is met. For example, the system can check if a relaxation limit has been reached or if an iteration cannot further reduce the set of reduced scenarios (step 706). If so, the system can terminate the relaxation process. Otherwise, the system can continue relaxation by returning to step 702.

Scenario reduction can be used in a number of ways to speed up the circuit design flow. Specifically, scenario reduction can be performed at multiple stages in the circuit design flow, and the aggressiveness of scenario reduction can be adapted based on the stage of the flow in which it is performed. As mentioned above, aggressive scenario reduction can be used at earlier stages of the flow and conservative scenario reduction can be used at later stages of the flow. More aggressive reduction can be achieved by a larger threshold for relaxation as well as a smaller threshold for robustness.

As mentioned above, multiple types of constraints may be optimized during circuit optimization. Different scenarios may have different levels of relevance and/or importance for different types of design constraints that are being optimized. For example, certain scenarios may have been specifically created for minimum-delay timing-constraints (also known as hold constraints).

Further, in a circuit optimization flow, certain optimization objectives may be optimized before other objectives. For example, a circuit design may be optimized for maximum-delay timing-constraints (also known as setup constraints) before it is optimized for minimum-delay timing-constraints.

Hence, in some embodiments of the present invention, the system performs scenario reduction based on the set of design constraints that are being optimized in the current stage of the design flow. For example, if the current stage of the design flow optimizes the circuit design for maximum-delay timing-constraints only, and minimum delay timing constraints will be optimized in a later stage while maintaining the maximum delay timing, then the system can perform scenario reduction based on maximum-delay timing-constraints and ignore other constraints in this stage. Using only a subset of the design constraints to perform scenario reduction is expected to result in a smaller subset of scenarios. For example, if only constraint C1 is considered in FIG. 2, matrix 200 will have fewer rows, which would be expected to result in a smaller subset of scenarios.

Figure 8:
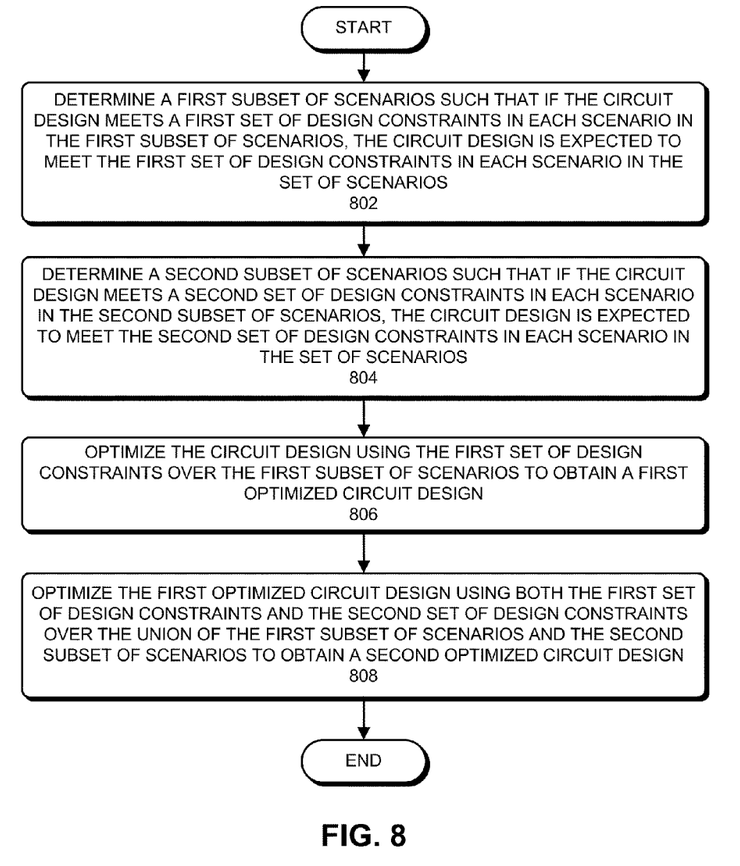
FIG. 8 presents a flowchart that illustrates a process for optimizing a circuit design over a set of scenarios in accordance with some embodiments of the present invention.

FIG. 8 presents a flowchart that illustrates a process for optimizing a circuit design over a set of scenarios in accordance with some embodiments of the present invention. For the sake of clarity and ease of discourse, the process illustrated in FIG. 8 is described in the context of two subsets of scenarios which correspond to two sets of design constraints. It will be apparent to a person having ordinary skill in the art that the process can be extended to more than two subsets of scenarios which correspond to more than two sets of design constraints.

The process can begin by determining a first subset of scenarios such that if the circuit design meets a first set of design constraints in each scenario in the first subset of scenarios, the circuit design is expected to meet the first set of design constraints in each scenario in the set of scenarios (step 802). For example, if the first set of design constraints are the C2 constraints in matrix 200, then the first subset of scenarios can be determined by solving the unate covering problem that corresponds to the C2 rows in matrix 200.

Next, the system can determine a second subset of scenarios such that if the circuit design meets a second set of design constraints in each scenario in the second subset of scenarios, the circuit design is expected to meet the second set of design constraints in each scenario in the set of scenarios (step 804). For example, if the second set of design constraints are the Cm constraints in matrix 200, then the second subset of scenarios can be determined by solving the unate covering problem that corresponds to the Cm rows in matrix 200.

A physical implementation flow typically includes a clock tree synthesis (CTS) stage in which the clock tree for the circuit design is created. The circuit design can be optimized in the design flow both before and after the CTS stage. However, optimizing the circuit design for minimum-delay timing-constraints may not be useful before the CTS stage because the clock information may not be sufficiently accurate. Hence, the system may ignore minimum-delay timing-constraints for pre-CTS optimization, and only consider these constraints after the CTS stage. In other words, in some embodiments, the first set of design constraints does not include minimum-delay timing-constraints, and the second set of design constraints includes minimum-delay timing-constraints. The process illustrated in FIG. 8 can apply to post-CTS optimization or pre-CTS optimization. Also note that the system may perform several iterations of the process illustrated in FIG. 8 in order to converge on all constraints of interest.

Continuing with the discussion of FIG. 8, the system can then optimize the circuit design using the first set of design constraints over the first subset of scenarios to obtain a first optimized circuit design (step 806).

In some embodiments, circuit information that relates to ignored constraints may not be updated during optimization. For example, if minimum-delay timing-constraints are ignored during pre-CTS optimization, the system may not update minimum-delay timing-information in the circuit design for the first subset of scenarios. However, since maximum-delay timing-constraints are considered in this stage, the system can update maximum-delay timing-information in the circuit design for the first subset of scenarios.

Moreover, the system can utilize a circuit design which was optimized using one set of design constraints to generate a second optimized circuit design using a second set of design constraints. In particular, the system can identify two sets of reduced scenarios, one for each set of constraints. During step 806, timing information for the first subset of scenarios is updated, and scenarios that exist in the second subset but do not exist in the first subset are ignored. Then, during step 808, the system can optimize the circuit design for the second set of design constraints subject to satisfying the first set of constraints (i.e., the circuit is optimized for the second set of design constraints without hurting or degrading the first set of constraints).

For example, during post-CTS optimization, the system can optimize the circuit design using one set of design constraints (e.g. max delay and DRC) first, and then optimize the circuit design further using a second set of design constraints (e.g. min delay).

Figure 9:
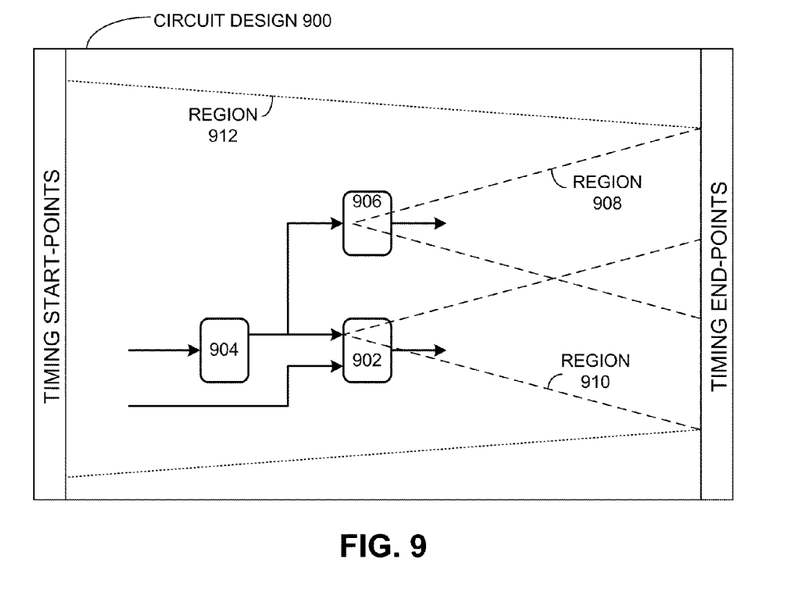
FIG. 9 illustrates updating timing information in a circuit design.

An optimization transformation can trigger a timing update in the circuit design. FIG. 9 illustrates updating timing information in a circuit design. Circuit design 900 can be part of a larger circuit design. A timing start-point or end-point can generally be any point in a circuit design where one or more timing requirements need to be satisfied. Specifically, a timing start-point can be a register output or a primary input, and a timing end-point can be a register input or a primary output.

Circuit design 900 includes logic gate 902. Applying an optimizing transformation to logic gate 902 can change the capacitive load on logic gate 904, which can change the arrival and transition times at logic gate 904's output, logic gate 902's input, and logic gate 906's input. These changes can ripple through regions 908 and 910 to the timing end-points of circuit design 900. This, in turn, can cause the required times in the entire fan-in cones of these timing end-points to be out-of-date. Hence, after propagating the timing information in the forward direction, required times are typically propagated in the backward direction, e.g., backward along region 912 to the timing start-points. Further details on static timing analysis and how timing information is updated can be found in Luciano Lavagno (Editor), Louis Scheffer (Editor), Grant Martin (Editor), *EDA for IC Implementation, Circuit Design, and Process Technology* (*Electronic Design Automation for Integrated Circuits Handbook*), CRC Press, 1$^{st}$ Ed., March 2006.

Continuing with the discussion of FIG. 8, the system can then optimize the first optimized circuit design using both the first set of design constraints and the second set of design constraints over the union of the first subset of scenarios and the second subset of scenarios to obtain a second optimized circuit design (step 808). Note that, if the system optimizes the first optimized circuit design using only the second set of design constraints, the system may undo the optimization that was performed in the previous stage, e.g., in step 806. This is especially true if the first set of design constraints and the second set of design constraints "pull" against each other, i.e., optimizing one set of design constraints tends to de-optimize the other set of design constraints. Hence, the union of the first subset of reduced scenarios (associated with the first set of design constraints) and the second subset of reduced scenarios (associated with the second subset of design constraints) are used and updated while optimizing the first optimized circuit design. For example, both maximum-delay timing-constraints (and the associated reduced set of scenarios that correspond to a maximum-delay) and minimum-delay timing-constraints (and the associated reduced set of scenarios that correspond to a minimum delay) are considered during minimum delay optimization in a post-CTS flow.

In some embodiments, the system generates three subsets of scenarios. The first subset is for the first set of constraints. The second subset is for the second set of constraints. The third subset is for the union of the first and second sets of constraints. Note that the third subset may be smaller than the union of the first two subsets because scenario reduction can reduce more scenarios from the union of two sets of scenarios.

As mentioned before, different scenarios may have different levels of relevance and/or importance for different types of design constraints. For example, if a particular scenario is relevant and/or important only for a specific type of constraint, then information that does not relate to that type of constraint does not need to be updated in the scenario. For example, suppose the first and second sets of design constraints relate to maximum- and minimum-delay timing-constraints, respectively. Then, during optimization, the system can update maximum-delay timing-information in the circuit design for the scenarios that are in the first subset of scenarios only, and not update maximum-delay timing-information in the circuit design for scenarios that are not in the first subset of scenarios. Further, during optimization, the system can update minimum-delay timing-information in the circuit design for the scenarios that are in the second subset of scenarios only, and not update minimum-delay timing-information in the circuit design for scenarios that are not in the second subset of scenarios. Note that, if a scenario is present in both the first subset and the second subset, then both maximum- and minimum-delay timing-information can be updated in the scenario.

For some constraint types, if two scenarios are relevant for the constraint type, then optimizing the circuit design only under only one scenario is unlikely to undo the optimizations that were performed in the other scenarios. To take a concrete example, suppose two scenarios, say S1 and S3, are of particular importance for minimum-delay timing-constraints. Further, suppose the circuit design is optimized for minimum-delay timing-constraints under scenario S1 only. Now, if the circuit design is optimized for minimum-delay timing-constraints under scenario S3 only (i.e. scenario S1 is not considered or updated while S3 is being optimized), this optimizing process is unlikely to undo the optimizing transformations that were applied when the circuit design was optimized under scenario S1. These transformations are unlikely to degrade minimum-delay scenario S1.

In step 808, some embodiments can optimize the first optimized circuit design by iterating through the second subset of scenarios. In particular, the system can order the second subset of scenarios in decreasing order of relevance and/or importance (e.g., by sorting the scenarios based on a relevance and/or importance score). Next, in each iteration, the system can select a scenario from the second subset of scenarios, and optimize the first optimized circuit design over the first subset of scenarios and the selected scenario from the second subset of scenarios. Relevant design information is updated only for the scenarios of the first subset of scenarios and the single scenario selected from the second subset of scenarios. All other scenarios are not updated, thereby speeding up the optimization process.

A relevance and/or importance score for a scenario can be determined using the values of the constrained objects associated with the scenario. For example, the system may determine a relevance and/or importance score for a scenario using the number of violating constrained objects, the sum of the values of the constrained objects, and/or the worst case constrained object.

As an example, suppose the system identifies a first reduced subset of scenarios {A, B} based on maximum-delay timing constraints. Next, suppose the system identifies a second reduced subset of scenarios {D, E} based on minimum-delay timing constraints. Let us also assume that scenario E has a higher score than scenario C. Now, the system can optimize the circuit design for maximum-delay timing constraints over scenarios {A, B}. Timing information in scenarios C, D, and E is not updated during this optimization process, thereby speeding up the optimization process. Next, the system can minimum-delay timing constraints over scenarios E, A, and B, wherein the system fixes minimum-delay violations in scenario E without degrading maximum-delay timing constraints in scenarios A and B. During this optimization process, minimum-delay timing information is updated only for scenario E, and maximum-delay timing information is updated only for scenarios A and B. Note that minimum-delay timing information is not updated for scenarios A & B. Similarly, maximum-delay timing information is not updated for scenario E. No information is updated for scenarios C and D. The system can then optimize minimum-delay timing constraints over scenarios D, A, and B, wherein the system can fix minimum-delay timing violations in scenario D without degrading maximum-delay timing constraints in scenarios A and B. During this optimization process, minimum-delay timing constraints are updated only in scenario D and maximum-delay timing constraints are updated only in scenarios A and B. Min delay is not updated for A & B. Similarly max delay is not updated for D. Further, no information is updated for C and E.

Some sections of a design flow may iteratively optimize a circuit design. These sections of the design flow could iterate through steps 802 through 808 of FIG. 8. In such iterative flows, scenario reduction can be performed before the iterative process as well as in each iteration to further reduce the number of scenarios. Additionally, the system can vary the aggressiveness of scenario reduction in different iterations.

For example, suppose at the beginning of the iterative optimization flow, the system performs scenario reduction to obtain a subset of scenarios S1. Next, the system can perform the iterative optimization on subset S1. At the beginning of each iteration, the system can again compute a reduced subset of scenarios from subset S1. Since the values of constrained objects may have changed, it may be possible to further reduce the number of scenarios by performing another round of scenario reduction. For example, the system can create a matrix (e.g., a matrix similar to matrix 200 in FIG. 2) using the constrained objects and the scenarios in subset S1. Next, the system can solve the corresponding unate covering problem to obtain subset S2 which may have a smaller cardinality than subset S1. In the optimization steps of that iteration, the system can perform optimization over the subset S2 instead of over the subset S1. In this manner, the system can try to reduce the number of scenarios after each optimization iteration.

As mentioned above, the system can vary the aggressiveness of scenario reduction depending on which iteration is being performed. For example, before the iterative optimization process begins, the system can perform scenario reduction without relaxation to obtain a subset of scenarios, say S1. Next, before each optimization iteration, the system can perform scenario reduction with relaxation to further reduce the number of scenarios, thereby improving performance. However, in the last iteration, the system can optimize the circuit design over subset S1 to ensure correctness, i.e., to ensure that the circuit design meets the design constraints in all scenarios in subset S1.

Figure 10:
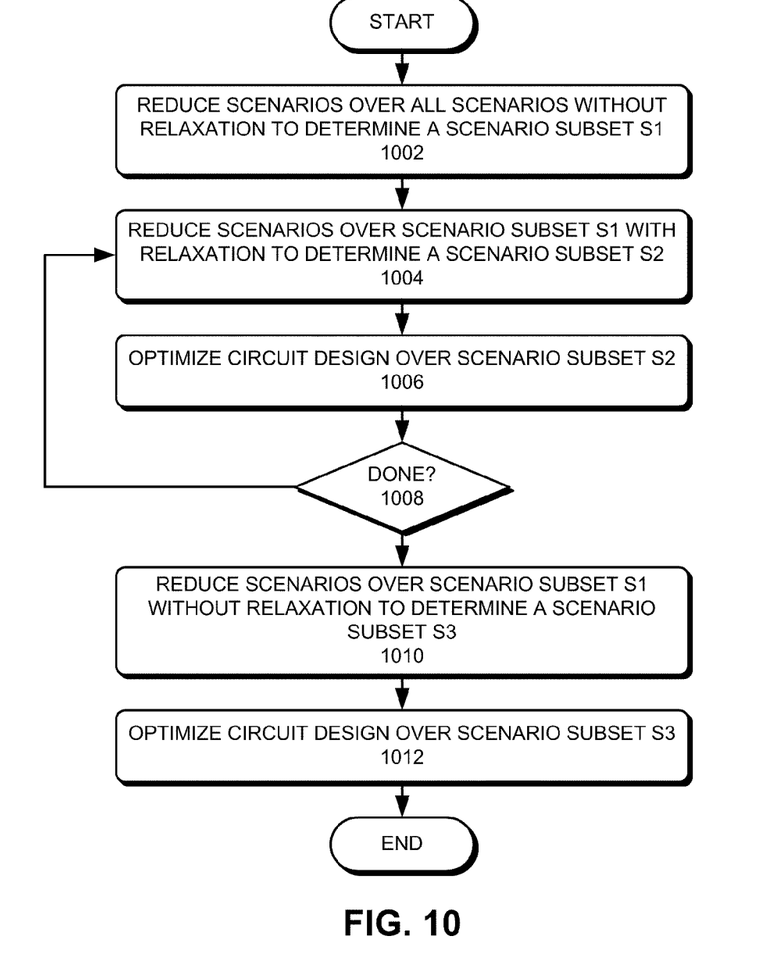
FIG. 10 presents a flowchart that illustrates a process for iteratively optimizing a circuit design over a set of scenarios in accordance with some embodiments of the present invention.

FIG. 10 presents a flowchart that illustrates a process for iteratively optimizing a circuit design over a set of scenarios in accordance with some embodiments of the present invention.

The process can begin by performing multiple optimization iterations on the circuit design over progressively larger subsets of scenarios. Specifically, the system can reduce scenarios over all scenarios without relaxation to determine a scenario subset S1 (step 1002). Then, the system can reduce scenarios over the S1 scenarios with relaxation to determine a scenario subset S2 (step 1004), and optimize the circuit design over scenario subset S2 (step 1006). During optimization the system updates timing information only for scenarios S2. Note that because scenario subset S2 is determined by performing scenario reduction with relaxation on S1, scenario subset S2 can be a subset of scenario subset S1. The system then determines whether the iterative optimization should be terminated (step 1008). If more iterations are required, the system can return to step 1004 to again perform scenario reduction with relaxation on subset S1. In each iteration, the system can adjust the aggressiveness of the relaxation. Specifically, the system can progressively become less aggressive in each iteration. Since less aggressive relaxation results in a larger subset of scenarios, the system may optimize the circuit design over progressively larger subsets of scenarios.

Once the system determines that the iterative relaxation and optimization process is complete, the system can reduce scenarios over S1 without relaxation to determine a scenario subset S3 (step 1010). The system can then optimize the circuit design over scenario subset S3 (step 1012). During this optimization, the system updates information only for scenarios in subset S3. In some embodiments, step 1010 can optionally perform scenario reduction over all scenarios (instead of over S1).

As explained above, performing scenario reduction with relaxation has a risk: the scenario reduction can be too aggressive, i.e., even if the circuit design meets design requirements in the reduced subset of scenarios, the circuit design may violate design requirements when the entire set of scenarios is considered. Hence, to ensure that the optimized circuit design meets design requirements for the entire set of scenarios, the system can perform at least one optimization iteration on the circuit design over a subset of scenarios which is determined by performing scenario reduction without relaxation on the set of scenarios (step 1004).

Note that performing scenario reduction without relaxation on the set of scenarios results in a conservative subset of scenarios, i.e., if the circuit design satisfies design constraints in each scenario in the conservative subset of scenarios, the circuit design is likely to meet the design constraints in each scenario in the set of scenarios. Since the last optimization iteration is performed over the conservative subset of scenarios which was obtained without relaxation, the optimized circuit design at the end of the iterative optimization process is expected to meet design requirements for the entire set of scenarios.

Figure 11:
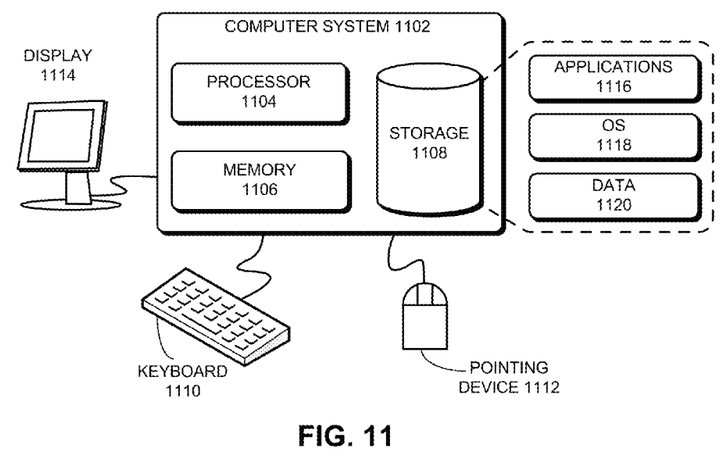
FIG. 11 illustrates a computer system in accordance with some embodiments of the present invention.

FIG. 11 illustrates a computer system in accordance with some embodiments of the present invention.

Computer system 1102 can include a processor 1104, a memory 1106, and a storage device 1108. Computer system 1102 can be coupled to a display device 1114, a keyboard 1110, and a pointing device 1112. Storage device 1108 can store operating system 1118, applications 1116, and data 1120.

Applications 1116 can include instructions which, when executed by computer system 1102, can cause computer system 1102 to perform processes which are inherently or explicitly described in this disclosure. Data 1120 can include any data that is required as input or that is generated as output by processes which are inherently or explicitly described in this disclosure.

Figure 12:
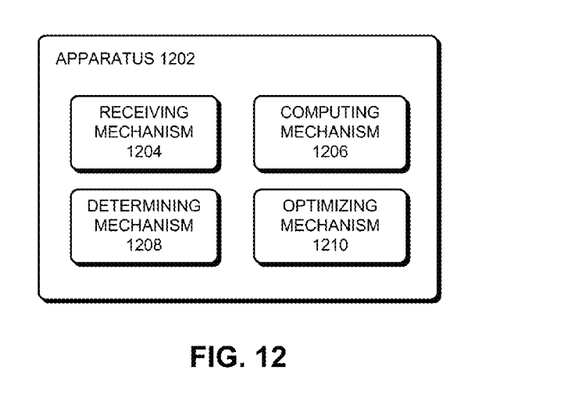
FIG. 12 illustrates an apparatus in accordance with some embodiments of the present invention.

FIG. 12 illustrates an apparatus in accordance with some embodiments of the present invention.

Apparatus 1202 can comprise a plurality of mechanisms which may communicate with one another via a wired or wireless communication channel. Apparatus 1202 may be realized using one or more integrated circuits, and apparatus 1202 may include fewer or more mechanisms than those shown in FIG. 12. Further, apparatus 1202 may be integrated in a computer system, or it may be realized as a separate device which is capable of communicating with other computer systems and/or devices.

Apparatus 1202 can include one or more mechanisms which are configured to perform operations which are inherently or explicitly described in this disclosure. Specifically, apparatus 1202 can include receiving mechanism 1204, computing mechanism 1206, determining mechanism 1208, and optimizing mechanism 1210. Receiving mechanism 1204 can be configured to receive a set of scenarios. Computing mechanism 1206 can be configured to compute values of constrained objects in the circuit design over the set of scenarios. Determining mechanism 1208 can be configured to determine a subset of scenarios based at least on the values of the constrained objects, wherein the subset of scenarios is such that if the circuit design meets design constraints in each scenario in the subset of scenarios, the circuit design is expected to meet the design constraints in each scenario in the set of scenarios. Optimizing mechanism 1210 can be configured to use the subset of scenarios to optimize a circuit design.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for optimizing a circuit design over a set of scenarios, the method comprising:
   determining a first subset of scenarios such that, if the circuit design meets a first set of design constraints in each scenario in the first subset of scenarios, the circuit design is expected to meet the first set of design constraints in each scenario in the set of scenarios, wherein the first set of design constraints does not include minimum-delay timing-constraints;
   determining a second subset of scenarios such that if the circuit design meets a second set of design constraints in each scenario in the second subset of scenarios, the circuit design is expected to meet the second set of design constraints in each scenario in the set of scenarios, wherein the second set of design constraints includes minimum-delay timing-constraints;
   optimizing the circuit design using the first set of design constraints over the first subset of scenarios to obtain a first optimized circuit design; and
   optimizing, by computer, the first optimized circuit design using the first set of design constraints and the second set of design constraints, wherein said optimizing the first optimized circuit design is performed over at least the second subset of scenarios to obtain a second optimized circuit design.

2. The method of claim 1, wherein optimizing the circuit design involves:
   updating maximum-delay timing-information in the circuit design for the first subset of scenarios; and
   not updating minimum-delay timing-information in the circuit design for the first subset of scenarios.

3. The method of claim 1, wherein optimizing the first optimized circuit design involves:
   updating maximum-delay timing-information in the circuit design for the first subset of scenarios;
   not updating maximum-delay timing-information in the circuit design for scenarios that are only in the second subset of scenarios;
   updating minimum-delay timing-information in the circuit design for the second subset of scenarios; and
   not updating minimum-delay timing-information in the circuit design for scenarios that are only in the first subset of scenarios.

4. The method of claim 1, wherein optimizing the first optimized circuit design involves iterating through the second subset of scenarios, wherein, in each iteration, a scenario from the second subset of scenarios is selected, and the first optimized circuit design is optimized over the first subset of scenarios and the selected scenario from the second subset of scenarios.

5. The method of claim 4, wherein the method comprises ordering scenarios in the second subset of scenarios in decreasing order of relevance or importance.

6. A non-transitory computer-readable storage medium storing instructions that when executed by a computer cause the computer to perform a method for optimizing a circuit design over a set of scenarios, the method comprising:
   determining a first subset of scenarios such that, if the circuit design meets a first set of design constraints in each scenario in the first subset of scenarios, the circuit design is expected to meet the first set of design constraints in each scenario in the set of scenarios, wherein the first set of design constraints does not include minimum-delay timing-constraints;
   determining a second subset of scenarios such that if the circuit design meets a second set of design constraints in each scenario in the second subset of scenarios, the circuit design is expected to meet the second set of design constraints in each scenario in the set of scenarios, wherein the first set of design constraints does not include minimum-delay timing-constraints;
   optimizing the circuit design using the first set of design constraints over the first subset of scenarios to obtain a first optimized circuit design; and
   optimizing the first optimized circuit design using the first set of design constraints and the second set of design constraints without degrading the first set of design constraints in the first subset of scenarios, wherein said optimizing the first optimized circuit design is performed over at least the second subset of scenarios to obtain a second optimized circuit design.

7. The non-transitory computer-readable storage medium of claim 6, wherein optimizing the circuit design involves:
   updating maximum-delay timing-information in the circuit design for the first subset of scenarios; and
   not updating minimum-delay timing-information in the circuit design for the first subset of scenarios.

8. The non-transitory computer-readable storage medium of claim 6, wherein optimizing the first optimized circuit design involves:
   updating maximum-delay timing-information in the circuit design for the first subset of scenarios;
   not updating maximum-delay timing-information in the circuit design for scenarios that are only in the second subset of scenarios;
   updating minimum-delay timing-information in the circuit design for the second subset of scenarios; and
   not updating minimum-delay timing-information in the circuit design for scenarios that are only in the first subset of scenarios.

9. The non-transitory computer-readable storage medium of claim 6, wherein optimizing the first optimized circuit design involves iterating through the second subset of scenarios, wherein, in each iteration, a scenario from the second subset of scenarios is selected, and the first optimized circuit design is optimized over the first subset of scenarios and the selected scenario from the second subset of scenarios.

10. The non-transitory computer-readable storage medium of claim 9, wherein the method comprises ordering scenarios in the second subset of scenarios in decreasing order of relevance or importance.

11. An apparatus for optimizing a circuit design over a set of scenarios, the apparatus comprising:
   a hardware-based determining mechanism configured to:
      determine a first subset of scenarios such that, if the circuit design meets a first set of design constraints in each scenario in the first subset of scenarios, the circuit design is expected to meet the first set of design constraints in each scenario in the set of scenarios, wherein the first set of design constraints does not include minimum-delay timing-constraints; and
      determine a second subset of scenarios such that if the circuit design meets a second set of design constraints in each scenario in the second subset of scenarios, the circuit design is expected to meet the second set of design constraints in each scenario in the set of scenarios, wherein the second set of design constraints includes minimum-delay timing-constraints; and
   a hardware-based optimizing mechanism configured to:
      optimize the circuit design using the first set of design constraints over the first subset of scenarios to obtain a first optimized circuit design; and
      optimize the first optimized circuit design using the first set of design constraints and the second set of design constraints, wherein said optimizing the first optimized circuit design is performed over at least the second subset of scenarios to obtain a second optimized circuit design.

12. The apparatus of claim 11, wherein the optimizing mechanism is configured to:
   update maximum-delay timing-information in the circuit design for the first subset of scenarios; and
   not update minimum-delay timing-information in the circuit design for the first subset of scenarios.

13. The apparatus of claim 11, wherein the optimizing mechanism is configured to:
   update maximum-delay timing-information in the circuit design for the first subset of scenarios;
   not update maximum-delay timing-information in the circuit design for scenarios that are only in the second subset of scenarios;
   update minimum-delay timing-information in the circuit design for the second subset of scenarios; and
   not update minimum-delay timing-information in the circuit design for scenarios that are only in the first subset of scenarios.

14. The apparatus of claim 11, wherein the optimizing mechanism is configured to iterate through the second subset of scenarios, wherein, in each iteration, a scenario from the second subset of scenarios is selected, and the first optimized circuit design is optimized over the first subset of scenarios and the selected scenario from the second subset of scenarios.

15. The apparatus of claim 14, wherein the optimizing mechanism is configured to order scenarios in the second subset of scenarios in decreasing order of relevance or importance.

16. A method for iteratively optimizing a circuit design over a set of scenarios, the method comprising:
   performing, by computer, multiple optimization iterations on the circuit design over progressively larger subsets of scenarios, wherein the subset of scenarios used in an iteration is determined by: relaxing a constrained object's value in a scenario based on the constrained object's value in a different scenario, and performing scenario reduction on the set of scenarios; and
   after performing the multiple optimization iterations, performing at least one optimization iteration on the circuit design over a subset of scenarios which is determined by performing scenario reduction without relaxation on the set of scenarios.

* * * * *